United States Patent [19]

Stark, Jr.

[11] 4,149,209

[45] Apr. 10, 1979

[54] OVER-VOLTAGE AMPLITUDE PREVENTION CIRCUIT FOR HIGH VOLTAGE AND DEFLECTION GENERATING SYSTEM

[75] Inventor: John Stark, Jr., Indianapolis, Ind.

[73] Assignee: RCA Corporation, New York, N.Y.

[21] Appl. No.: 757,376

[22] Filed: Jan. 6, 1977

Related U.S. Application Data

[63] Continuation of Ser. No. 601,117, Jul. 31, 1975, abandoned.

[51] Int. Cl.² .................................................. H02H 3/20
[52] U.S. Cl. .......................................... 361/91; 358/74; 358/243; 361/56; 361/104
[58] Field of Search .................... 361/56, 91, 18, 59, 361/100, 104, 112, 55, 57; 328/7–9; 363/211; 315/20, 22; 358/74, 243

[56] References Cited

U.S. PATENT DOCUMENTS

| 2,603,708 | 7/1952 | Anger | 328/9 |
| 3,546,536 | 12/1970 | Umin | 328/9 X |
| 3,560,650 | 2/1971 | Hofmann | 178/7.5 R |
| 3,611,002 | 10/1971 | Wedam | 178/7.5 R |
| 3,670,234 | 6/1972 | Joyce | 361/18 X |
| 3,733,519 | 5/1973 | Griffey | 361/91 |
| 3,813,578 | 5/1974 | Tiffany | 361/88 |
| 3,813,580 | 5/1974 | Norman | 361/59 |
| 3,885,201 | 5/1975 | Fersler | 178/7.5 R |

*Primary Examiner*—Patrick R. Salce
*Attorney, Agent, or Firm*—Eugene M. Whitacre; Paul J. Rasmussen; Joseph Laks

[57] ABSTRACT

A diode is coupled between a winding of the high voltage transformer and a source of direct current potential and is polarized in a manner which provides for non-conduction when the deflection system is operating properly. When the deflection system malfunctions in a manner to increase the amplitude of signals developed thereby, the signals forward bias the diode and provide the clamping of one polarity of the signal to the direct current potential level.

5 Claims, 6 Drawing Figures

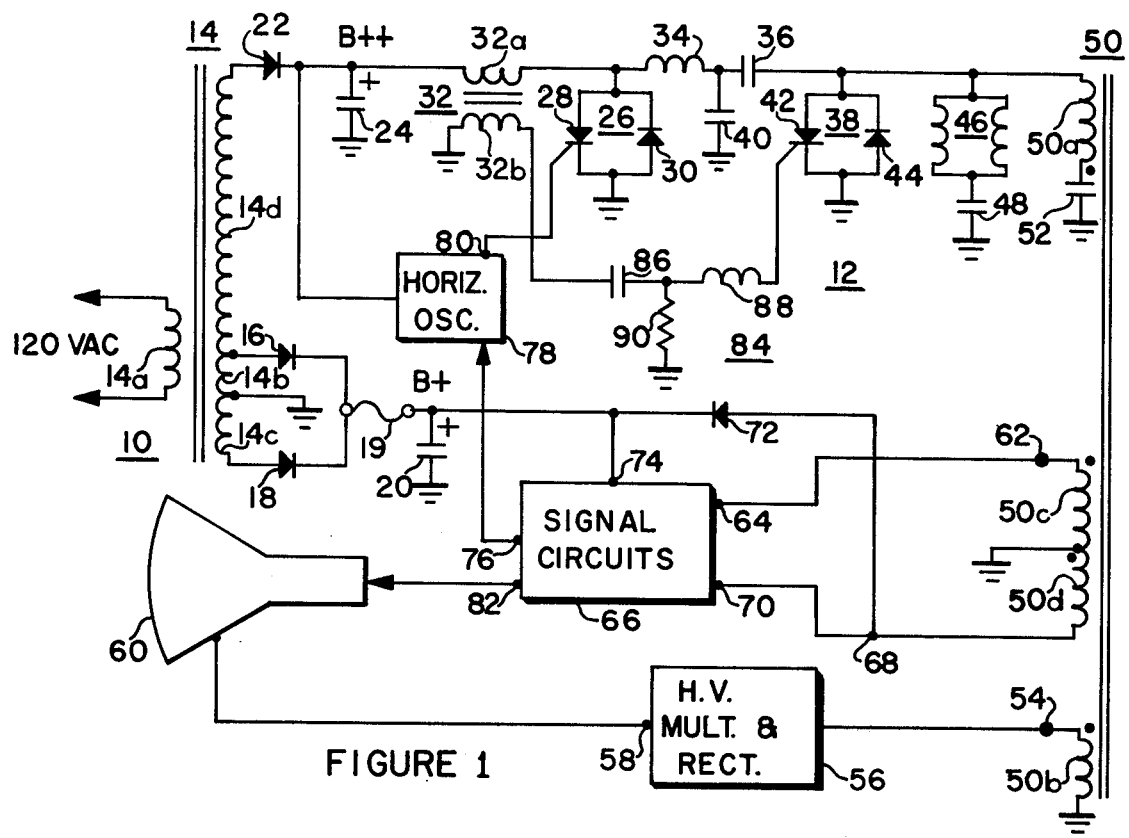
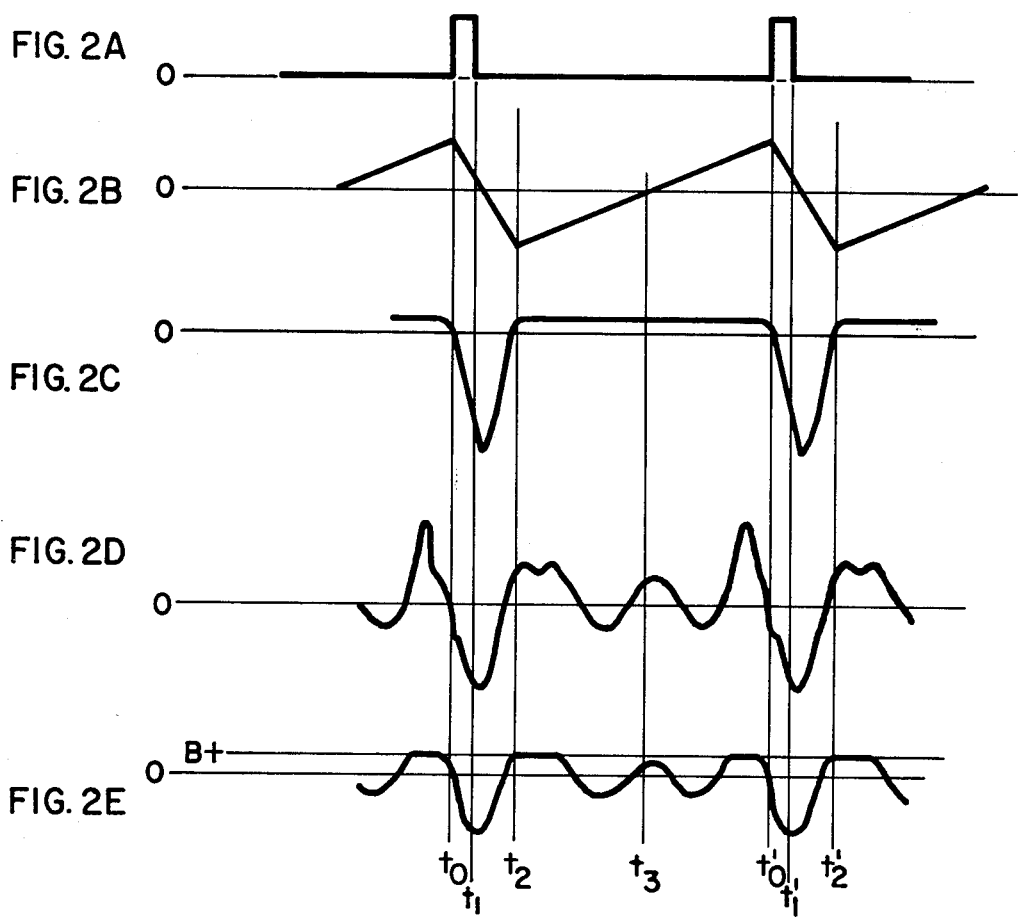
FIGURE 1
FIG. 2A
FIG. 2B
FIG. 2C
FIG. 2D
FIG. 2E

OVER-VOLTAGE AMPLITUDE PREVENTION CIRCUIT FOR HIGH VOLTAGE AND DEFLECTION GENERATING SYSTEM

This is a continuation of application Ser. No. 601,117, filed July 31, 1975, and now abandoned.

BACKGROUND OF THE INVENTION

The invention relates to a high voltage overvoltage prevention circuit.

High voltage and deflection generating systems utilized in television receivers include the type disclosed in U.S. Pat. No. 3,452,244, which utilizes a trace switch to couple a deflection winding and a primary winding of a high voltage transformer across a source of energy during a trace interval of each deflection cycle and a commutating switch to supply replenishing energy to the source of energy during a commutating interval of each deflection cycle.

The signals developed on various secondary windings of the high voltage transformer are normally of predominantly one polarity during each deflection cycle. A high voltage multiplier and rectifier coupled to a first secondary winding of the high voltage transformer provides for multiplication and rectification of the signal on the first secondary winding, thereby providing an appropriate magnitude high voltage for the ultor anode of the kinescope tube. Other secondary windings provide signals to signal circuits of the television receiver to provide synchronization between deflection and the signal circuits.

When a failure of the trace switch or the circuitry which provides control of the trace switch occurs, the signals developed by the secondary windings of the high voltage transformer have nearly equal amplitude positive and negative maximum excursions. With this abnormal signal condition on the secondary windings, the multiplier and rectifier coupled to the first secondary winding creates an over-voltage condition at the ultor electrode of the kinescope (i.e., nearly one and one-half times the normal magnitude of high voltage). This over-voltage condition can result in damage to the kinescope. Also, the abnormal polarity conditions on other secondary windings may result in damage to signal circuits of the television receiver.

SUMMARY OF THE INVENTION

In accordance with the invention, a high voltage protection circuit including a power supply means for developing a first direct current potential of a first polarity and a predetermined amplitude. A signal generating means coupled to the power supply means generates, under normal conditions, alternating current signals, a first polarity of which having an amplitude less than the predetermined amplitude. Rectifying and multiplying means coupled to the signal generating means develops a high voltage in response to the alternating current signals. A unidirectional current conducting device is coupled to the signal generating means and the power supply means and is polarized to provide conduction between the signal generating means and the power supply means when the alternating current signals exceed the predetermined amplitude of the first polarity, thereby preventing an increase of the high voltage.

A more detailed description of a preferred embodiment of the invention is given in the following detailed description and accompanying drawing of which:

FIG. 1 is a schematic diagram, partially in block form, of a television receiver including a high voltage and deflection generating system embodying the invention; and FIGS. 2A–2E are normalized waveforms obtained at various points in the schematic diagram of FIG. 1.

DESCRIPTION OF THE INVENTION

FIG. 1 is a schematic diagram, partially in block form, of a television receiver 10 including a high voltage and deflection generating system 12. The high voltage and deflection generating system 12 is of the retrace driven type similar to that disclosed in U.S. Pat. No. 3,452,244.

A primary winding 14a of a power transformer 14 is coupled to a source of alternating current potential (not shown). Windings 14b and 14c are coupled in series combination and have their common connection coupled to reference potential. The other terminal of winding 14b is coupled to the anode electrode of a rectifier diode 16 and the other terminal of winding 14c is coupled to the anode electrode of a rectifier diode 18. The cathode electrodes of diodes 16 and 18 are coupled through a series combination of a fuse 19 and a filter capacitor 20 to reference potential. The junction of diodes 16 and 18 and capacitor 20 provides a first source of direct current potential (B+) when winding 14a is energized by the source of alternating current potential.

A winding 14d has a first terminal coupled to the anode of diode 16 and another terminal coupled to the anode of a rectifier diode 22. The cathode electrode of diode 22 is coupled through a filter capacitor 24 to reference potential. The junction of rectifier 22 and capacitor 24 provides a second source of direct current potential (B++) when winding 14a of power transformer 14 is energized by the alternating current potential source.

The high voltage and deflection generating system 12 includes a commutating switch 26 comprising a silicon controlled rectifier (SCR) 28 and an oppositely poled damper diode 30. The commutating switch 26 is coupled between a winding 32a of an input reactor 32 and reference potential. The other terminal of winding 32a is coupled to B++.

Commutating switch 26 is also coupled through a commutating coil 34, a commutating capacitor 36, and a trace switch 38 to reference potential. Auxiliary capacitor 40 is coupled between the junction of coil 34 and capacitor 36 and reference potential. Trace switch 38 comprises an SCR 42 and an oppositely poled damper diode 44. A series combination of horizontal deflection windings 46 and an S-shaping capacitor 48 is coupled in parallel with trace switch 38. Also, a series combination of a primary winding 50a of a high voltage transformer 50 and a DC blocking capacitor 52 is coupled in parallel with trace switch 38.

A winding 32b of input reactor 32 has a first terminal coupled to reference potential and another terminal coupled through a waveshaping network 84 comprising capacitor 86, inductor 88 and resistor 90, to the gate electrode of SCR 42, thereby providing for appropriate gating of the trace switch 38.

A secondary winding 50b of transformer 50 has a first terminal coupled to reference potential and another terminal 54 coupled to a high voltage multiplier and rectifier 56. The high voltage multiplier and rectifier 56 provides for multiplication and rectification of pulses developed across winding 50b to provide a source of high voltage at an output terminal 58. Output terminal 58 of high voltage multiplier and rectifier 56 is coupled to the ultor electrode of a kinescope tube 60.

Windings 50c and 50d have first terminals coupled to reference potential. Another terminal 62 of winding 50c is coupled to a terminal 64 of signal circuits 66. Another terminal 68 of winding 50d is coupled to a terminal 70 of signal circuits 66 and coupled through a diode 72 to B+. Terminal 74 of signal circuits 66 is also coupled to B+.

The signal circuits 66 process composite video signals and produce video signals at an output terminal 82. The signal circuits 66 also produce a synchronizing signal at an output terminal 76 which provides for the synchronization of the signals produced by windings 50c and 50d with the composite video signal.

The output terminal 76 and B++ are coupled to a horizontal oscillator 78 and provide for an SCR gating pulse at an output terminal 80 as shown in FIG. 2A. The output terminal 80 is coupled to the gate electrode of SCR 28.

The output terminal 82 of signal circuits 66 is coupled to the emission control electrodes of kinescope tube 60 and provide for modulation of the intensity of the beam of electrons in the kinescope tube 60.

In operation, when alternating current is applied to winding 14a of power transformer 14, B+ is developed at the positive terminal of filter capacitor 20 and B++ is developed at the positive terminal of filter capacitor 24.

In order to emphasize the operation of the television receiver 10 with the over-voltage protection circuit, operation of the television receiver will be first explained with all components functioning properly, second explained with a malfunction of the trace switch 38 without diode 72 connected, and third explained with a malfunction of the trace switch 38 with diode 72 connected. It will also be assumed that at $t_0$, as shown in FIGS. 2A-2E, that B++ and B+ have been present for a sufficient period of time to stabilize the operation of the television receiver (i.e., beyond the transient period).

At $t_0$ the voltage at the output terminal 80 of horizontal oscillator 78 makes a transition from a logic 0 to a logic 1 as shown in FIG. 2A. Transition from a logic 0 to a logic 1 at output terminal 80 provides for conduction of the SCR 28 and initiates the commutating interval ($t_0 - t_2$) of the deflection cycle ($t_0 - t_0'$). During the commutating interval, energy which is stored in commutating capacitor 36 and auxiliary capacitor 40 is used to provide a retrace current in the yoke windings 46 as shown in FIG. 2B and a voltage pulse across winding 50a of high voltage transformer 50 similar in shape to that shown in FIG. 2C during the interval $t_0 - t_2$.

At $t_1$ the output terminal 80 of horizontal oscillator 78 makes a transition from a logic 1 to a logic 0, thereby providing for a turnoff of commutating switch 26 at $t_2$. At $t_2$ the commutating switch 26 turns off and the current flowing through yoke windings 46 and winding 50a of high voltage transformer 50 begins to flow through the damper diode 44 and capacitors 36 and 40 begin to charge from B++ through winding 32a, commutating coil 34 and trace switch 38. A signal developed across winding 32b of input reactor 32 is waveshaped by the waveshaping network 84 and provides for a positive voltage on the gate electrode of SCR 42 of the trace switch 38 prior to $t_3$ as shown in FIG. 2B in order to provide for the sustaining of current flow through the yoke windings 46 and winding 50a during the interval $t_3 - t_0'$.

The pulse developed across winding 50a of high voltage transformer 50 produces a pulse during the interval $t_0 - t_2$ at terminal 68 of winding 50d as shown in FIG. 2C. The pulse developed at terminal 62 of winding 50c and terminal 54 of winding 50b are the same shape as shown in FIG. 2C but are of inverted polarity. The pulse developed at terminal 54 of winding 50b provides a normal high voltage at the ultor electrode of the kinescope tube 60.

Under normal operation, the positive excursion of the voltage at terminal 68 of winding 50d is much less than B+; therefore, the diode 72 is non-conducting. With diode 72 non-conducting, no significant current flows between terminal 68 of winding 50d and B+.

In the absence of diode 72, if the trace switch 38 fails to operate in a manner hereinbefore described due to a failure of the winding 32b, waveshaping network 84, SCR 42 or interconnections therebetween, the deflection circuit 12 produces a signal at terminal 68 of winding 50d similar to that shown in FIG. 2D. Also, a signal is produced at terminal 62 of winding 50c and terminal 54 of winding 50b which is similar to that shown in FIG. 2D but of an inverted polarity. The signal developed at terminal 54 of winding 50b under these conditions has a much greater peak-to-peak amplitude than the normal signal and produces a voltage at output terminal 58 of high voltage multiplier and rectifier 56 which is approximately one and one-half that which is developed when the trace switch 38 is operating normally. This over-voltage on the ultor electrode of kinescope tube 60 may result in permanent damage to the kinescope tube. The voltage similar to that shown in FIG. 2D which is developed on terminals 62 and 68 of windings 50c and 50d, respectively, subjects signal circuits 66 to unusual stress since they are designed to operate with a particular polarity at terminals 62 and 68.

With diode 72 coupled between terminal 68 of winding 50d and B+, the maximum positive excursion of the voltage at terminal 68 is clamped to approximately B+ as shown in FIG. 2E. The clamping of the voltage at terminal 68 to approximately B+ is accomplished due to the loading of winding 50d via diode 72 by signal circuits 66 when rectifier diodes 16 and 18 are reverse biased. This unusual loading of the deflection circuit 12 prevents the over-voltage generation at output terminal 58 of high voltage multiplier and rectifier 56 and the resultant unusual stress of the kinescope tube.

By choosing a low frequency type diode 72, i.e., a diode not designed to operate at the 15,750 KHz horizontal deflection rate, malfunction of the trace switch 38 will provide for sufficient dissipation in the diode 72 to cause diode 72 to short, thus becoming bidirectionally conductive. With diode 72 shorted, there will be a low impedance path from B+ to reference potential through diode 72 and winding 50d. This low impedance will provide for opening of the fuse 19, thereby eliminating the B+ supply and rendering the signal circuits inoperative. With the signal circuits inoperative and diode 72 presenting a low impedance to both polarities of the signal at terminal 68 via capacitor 20, the voltage at the ultor electrode of kinescope 60 is greatly diminished.

As can be seen by a study of the aforementioned description of operation, it can be seen that the diode 72 provides for a clamping of the voltage at terminal 54 of winding 50b, thereby preventing an over-voltage on the ultor electrode of kinescope 60. Additionally, the diode 72 when properly chosen will provide for a fuse failure, thereby rendering the television receiver 10 inoperative until the trace switch fault is repaired.

What is claimed is:

1. In a high voltage and deflection generating system, a high voltage protection circuit comprising:
   power supply means for developing a first direct current potential of a first polarity and a predetermined amplitude for providing a load current;
   an output transformer with a first winding;
   signal generating means coupled to said output transformer for generating, under normal conditions, alternating current signals in said first winding, a first polarity potential of which having an amplitude less than said predetermined amplitude;
   a high voltage winding of said output transformer coupled to said signal generating means for developing a high voltage in response to said alternating current signals; and
   a unidirectional current conducting device directly coupled to said first winding of said output transformer and said power supply means and polarized to provide conduction between said power supply means and said first winding when said alternating current signals exceed said predetermined amplitude of said first polarity, said output transformer replacing said power supply means in providing said load current when said unidirectional current conducting device conducts current, said load current of a magnitude that will increase the loading of said output transformer sufficiently during conduction of said unidirectional current conducting device to directly clamp the voltage at said first winding to that of said first direct current potential for effectively clamping the voltage at said high voltage winding to a level of sufficiently small magnitude to prevent an increase of said high voltage.

2. In a high voltage and deflection generating system, a high voltage protection circuit comprising:
   power supply means including a rectifying means coupled to a source of alternating current potential for providing a first direct current potential of a first polarity and a predetermined amplitude;
   an output transformer;
   signal generating means coupled to said output transformer for generating, under normal conditions, alternating current signals in said output transformer, a first polarity potential of which having an amplitude less than said predetermined amplitude;
   high voltage means coupled to said signal generating means for developing a high voltage in response to said alternating current signals; and
   a unidirectional current conducting device coupled to said output transformer and said power supply means and polarized to provide conduction between said power supply means and said output transformer when said alternating current signals exceed said predetermined amplitude of said first polarity, said rectifying means disabling said source of alternating current potential during conduction of said unidirectional current conducting means, said output transformer replacing said power supply means in providing an operating potential when said unidirectional current conducting device conducts current for substantially increasing the loading of said output transformer, thereby preventing an increase of said high voltage.

3. In a high voltage and deflection generating system, a high voltage protection circuit comprising:
   power supply means for providing a first direct current potential of a first polarity and a predetermined amplitude;
   fusing means coupled to said power supply means for irreversibly disabling said power supply means when excessive current is drawn from said power supply means;
   an output transformer;
   signal generating means coupled to said output transformer for generating, under normal conditions, alternating current signals in said output transformer, a first polarity potential of which having an amplitude less than said predetermined amplitude;
   high voltage means coupled to said signal generating means for developing a high voltage in response to said alternating current signals; and
   a unidirectional current conducting device coupled to said output transformer and said power supply means and polarized to provide conduction between said power supply means and said output transformer when said alternating current signals exceed said predetermined amplitude of said first polarity, said output transformer replacing said power supply means in providing an operating potential when said unidirectional current conducting device conducts current, said unidirectionally current conducting device selected to become bidirectionally conductive after conducting substantial amounts of current for drawing sufficient amounts of current from said power supply means to activate said fusing means.

4. A high voltage protection circuit according to claim 3 wherein said unidirectional current conducting device comprises a diode.

5. In a high voltage and deflection generating system, a high voltage protection circuit comprising:
   power supply means for providing a first direct current potential of a first polarity and a predetermined amplitude;
   an output transformer;
   signal generating means coupled to said output transformer for generating, under normal conditions, alternating current signals in a first winding of said output transformer, a first polarity potential of which having an amplitude less than said predetermined amplitude;
   a high voltage winding of said output transformer coupled to said signal generating means for developing a high voltage in response to said alternating current signals; and
   a unidirectional current conducting device directly coupled to said first winding of said output transformer and said power supply means and polarized to provide conduction between said power supply means and said output transformer when said alternating current signals exceed said predetermined amplitude of said first polarity, for directly clamping during conduction of said unidirectional current conducting device the magnitude of said first polarity potential of said alternating current signals in said first winding to said predetermined magnitude for clamping a voltage excursion in said high voltage winding to a level sufficiently small to prevent an increase of said high voltage.

* * * * *